United States Patent
Kim et al.

(10) Patent No.: US 9,438,205 B2
(45) Date of Patent: Sep. 6, 2016

(54) TEMPERATURE-COMPENSATED OSCILLATOR AND DEVICE INCLUDING THE SAME

(71) Applicant: Samsung Electronics Co., Ltd., Suwon-si, Gyeonggi-do (KR)

(72) Inventors: Jun Ho Kim, Yongin-si (KR); Jong Pil Cho, Hwaseong-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/518,161

(22) Filed: Oct. 20, 2014

(65) Prior Publication Data

US 2015/0116042 A1   Apr. 30, 2015

(30) Foreign Application Priority Data

Oct. 30, 2013  (KR) .................. 10-2013-0130436

(51) Int. Cl.
| | | |
|---|---|---|
| H03K 3/03 | (2006.01) | |
| H03K 3/011 | (2006.01) | |
| H03L 1/02 | (2006.01) | |
| H03L 5/00 | (2006.01) | |

(52) U.S. Cl.
CPC ............. H03K 3/011 (2013.01); H03K 3/0315 (2013.01); *H03L 1/02* (2013.01); *H03L 1/022* (2013.01); *H03L 5/00* (2013.01)

(58) Field of Classification Search
CPC ...... H03K 3/011; H03K 3/0315; H03L 1/02; H03L 5/00; H03L 1/022
USPC ................. 331/57, 66, 70, 176, 185
See application file for complete search history.

(56) References Cited

U.S. PATENT DOCUMENTS

| | | | |
|---|---|---|---|
| 5,544,120 A | 8/1996 | Kuwagata et al. | |
| 5,731,727 A * | 3/1998 | Iwamoto | H03L 7/081 327/158 |
| 6,411,149 B1 * | 6/2002 | Ooishi | H03K 5/133 327/262 |
| 7,391,274 B2 * | 6/2008 | Hsu | H03K 3/011 331/185 |
| 2003/0214361 A1 * | 11/2003 | Nishikido | H03K 3/0315 331/57 |
| 2005/0141589 A1 * | 6/2005 | Kwon | G01K 7/32 374/117 |
| 2005/0206466 A1 | 9/2005 | Sohn et al. | |
| 2008/0061894 A1 | 3/2008 | Raita et al. | |
| 2012/0223778 A1 * | 9/2012 | Shin | H03K 3/0315 331/34 |

FOREIGN PATENT DOCUMENTS

| | | |
|---|---|---|
| JP | 09-083309 | 3/1997 |
| JP | 09-191214 | 7/1997 |
| JP | 09-270692 | 10/1997 |
| KR | 1992-0001920 | 3/1992 |
| KR | 10-0386931 | 6/2003 |
| KR | 1020040059757 | 7/2004 |
| KR | 1020040091276 | 10/2004 |
| KR | 1020100081472 | 7/2010 |
| KR | 10-1053259 | 8/2011 |
| KR | 1020110133434 | 12/2011 |

* cited by examiner

*Primary Examiner* — Richard Tan
(74) *Attorney, Agent, or Firm* — Muir Patent Law, PLLC

(57) ABSTRACT

A temperature-compensated oscillator and a device including the same include an oscillation unit configured to generate an oscillation signal using an operating current and an operating voltage, a bias circuit configured to control the operating current so that a frequency of the oscillation signal increases as a temperature increases, and a voltage generation unit configured to generate the operating voltage that varies with the temperature.

19 Claims, 14 Drawing Sheets

TEMPERATURE-COMPENSATED OSCILLATOR AND DEVICE INCLUDING THE SAME

CROSS-REFERENCE TO RELATED APPLICATIONS

This application claims priority under 35 U.S.C. §119(a) from Korean Patent Application No. 10-2013-0130436 filed on Oct. 30, 2013, the disclosure of which is hereby incorporated by reference in its entirety.

BACKGROUND

1. Field

Embodiments of the inventive concept relate to an electronic circuit, and more particularly, to an oscillator to generate a clock signal and a device including the same.

2. Description of the Related Art

A ring oscillator is usually used to generate a reference clock signal. In order to minimize a frequency change with respect to a temperature change, a temperature-compensated current which is the same as a current generated in a band gap reference (BGR) circuit is usually used in a ring oscillator design. However, a circuit for generating the temperature-compensated current usually includes a single operational amplifier and a plurality of resistors, and therefore, it is hard to be implemented in a design for an ultra-low current (e.g., nano-current) operation such as a standby mode (or a stop mode).

An ultra-low current reference clock generator requires a stable frequency characteristic with respect to temperature change and a minimum operation current as well. However, it is hard to satisfy these requirements with a conventional design method that requires several resistance elements with a resistance ranging from several MΩ to several tens of MΩ.

SUMMARY

The present general inventive concept provides an oscillator to generate a stable oscillation signal with respect to a temperature change, and an electronic device having the same.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a temperature-compensated oscillator including an oscillation unit configured to generate an oscillation signal using an operating current and an operating voltage, a bias circuit configured to control the operating current so that a frequency of the oscillation signal increases as temperature increases, and a voltage generation unit configured to generate the operating voltage that varies with the temperature. The voltage generation unit compensates for a change in a frequency of the oscillation signal with respect to a change in the temperature complementarily with the bias circuit by controlling the operating voltage so that the frequency of the oscillation signal decreases as the temperature increases.

The oscillation unit may include an odd number of inverters connected in series in a ring shape and at least one current source of a first current source which is connected between a first operating voltage in the operating voltage and the inverters and is controlled by the bias circuit and a second current source which is connected to the inverters and a second operating voltage in the operating voltage and is controlled by the bias circuit.

The bias circuit may include a current source proportional to absolute temperature (PTAT) current source configured to generate the operating current that increases as the temperature increases.

The voltage generation unit may include an operating voltage generation transistor which is connected between a supply voltage and the first operating voltage and has a diode connection.

The voltage generation unit may further include an operating voltage generation transistor which is connected between a ground voltage and the second operating voltage and has a diode connection.

The voltage generation unit may further include a bulk voltage controller configured to control a bulk voltage of the operating voltage generation transistor in response to a digital control signal included of at least two bits.

The PTAT current source may include a first transistor having a gate and a drain connected in common to a first node, a fourth transistor having a gate and a drain connected in common to a third node, a fifth transistor having a gate connected to the third node and a drain connected to a fourth node, a sixth transistor having a source connected to the supply voltage, a gate connected to the fourth node, and a drain connected to the third node, a seventh transistor having a gate and a drain connected in common to the fourth node and a source connected to the supply voltage, and an eighth transistor having a gate connected to the fourth node, a source connected to the supply voltage, and a drain connected to the first node.

The first node may be connected to the second current source.

The PTAT current source may further include a second transistor having a gate connected to the first node and a drain connected to a second node and a third transistor having a gate and a drain connected in common to the second node and a source connected to the first operating voltage. The second node may be connected to the first current source.

The foregoing and/or other features and utilities of the present general inventive concept may also be achieved by providing a temperature-compensated oscillator including an oscillation unit configured to generate an oscillation signal using an odd number of inverters connected in series in a ring shape, a bias circuit configured to increase an operating current of each of the inverters as temperature increases, and at least one transistor of a first operating current generation transistor which is connected between a supply voltage and a first operating voltage and has a diode connection and a second operating current generation transistor which is connected between a ground voltage and a second operating voltage and has the diode connection. The temperature-compensated oscillator increases or decreases an operating voltage of the inverters according to an increase of the temperature.

The oscillation unit may include at least one current source of a first current source which is connected between the first operating voltage and the inverters and is controlled by the bias circuit and a second current source which is connected to the inverters and the second operating voltage and is controlled by the bias circuit.

The foregoing and/or other features and utilities of the present general inventive concept may also be achieved by providing an electronic device including a temperature-compensated oscillator configured to generate an oscillation signal having an output frequency insensitive to a temperature change and a logic circuit configured to operate in response to the oscillation signal. The temperature-compensated oscillator includes an oscillation unit configured to generate the oscillation signal using an odd number of inverters connected in series in a ring shape, a bias circuit configured to increase an operating current of each of the inverters as temperature increases, and a voltage generation unit configured to increase an operating voltage put across both ends of each inverter as the temperature increases.

The foregoing and/or other features and utilities of the present general inventive concept may also be achieved by providing a temperature-compensated oscillator usable with an electronic device, the oscillator including an oscillation unit having inverters as a ring oscillator to be supplied with an operating voltage and an operating current which are variable according to a temperature change and to output an oscillation signal such that a characteristic of the operating current and a characteristic of the operating voltage can be offset to maintain a frequency of the oscillation signal stable regardless of the temperature change.

The temperature-compensated oscillator may further include a bias circuit having transistors to generate the operating current to increase when a temperature increase, and a voltage generation unit to generate the operating voltage to be changed with the temperature.

The variable operating voltage and the variable operating current may be simultaneously applied to the corresponding inverters of the oscillation unit.

In the temperature-compensated oscillator, an association of the variable operating voltage and the variable operating current may reduce a variation of a frequency of the oscillation signal.

The oscillation unit may generate the oscillation signal with frequencies to be usable in corresponding different modes according to the operating voltage variable according to the temperature change and a further adjustment or the operating current variable according to the temperature change and a further adjustment.

The operating current may be supplied between the operating voltage and the corresponding inverters.

The oscillation signal may have a frequency with a variation within a range of about 2% with respect to a reference frequency in the temperature change between 20° C. and 80° C.

The foregoing and/or other features and utilities of the present general inventive concept may also be achieved by providing an electronic device including a temperature-compensated oscillator described above or hereinafter, and a logic circuit to receive the oscillation signal from the temperature-compensated oscillator to perform a function of the electronic device.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
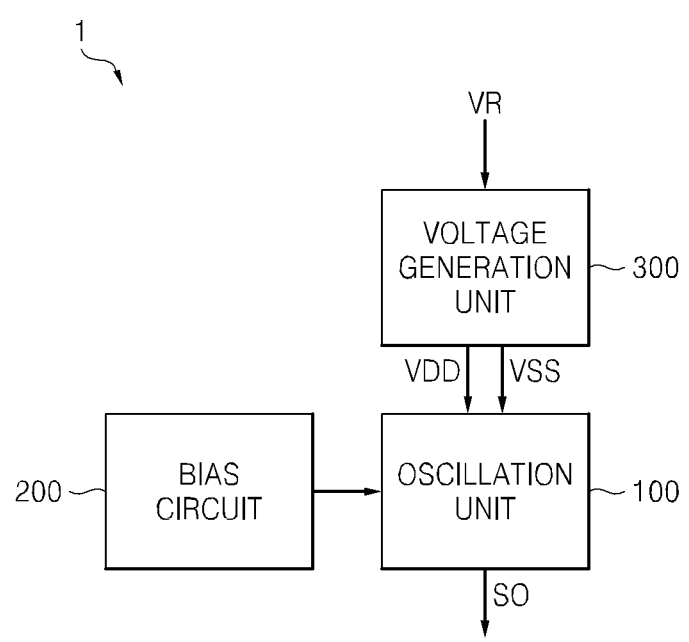
FIG. 1 is a schematic block diagram illustrating a temperature-compensated oscillator according to an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. This invention may, however, be embodied in many different forms and should not be construed as limited to the embodiments set forth herein. Rather, these embodiments are provided so that this disclosure will be thorough and complete, and will fully convey the scope of the present general inventive concept to those skilled in the art. In the drawings, the size and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
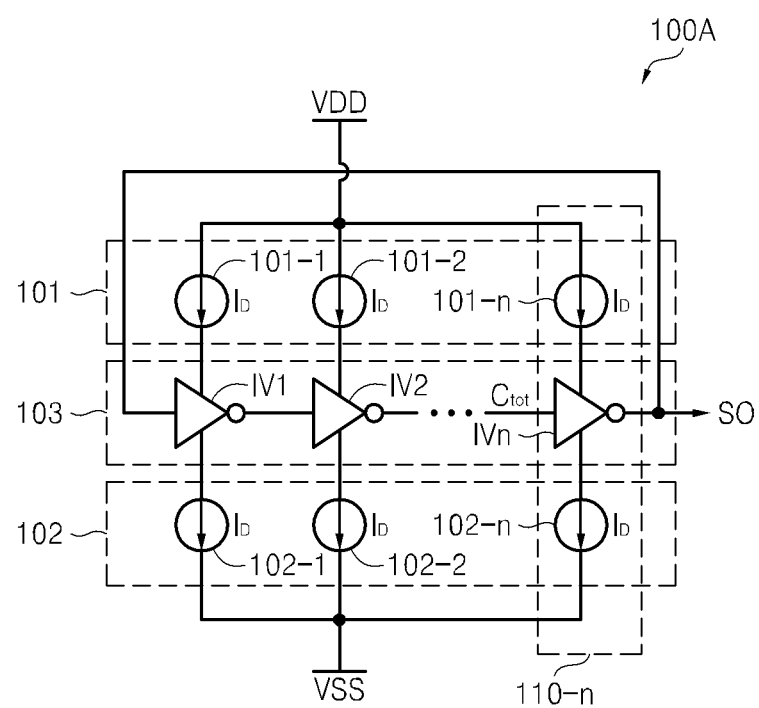
FIG. 2 is a schematic circuit diagram illustrating an oscillation unit of FIG. 1 according to an embodiment of the present general inventive concept.

FIG. 1 is a schematic block diagram illustrating a temperature-compensated oscillator 1 according to an embodiment of the inventive concept. FIG. 2 is a schematic circuit diagram illustrating an oscillation unit 100A usable as an oscillation unit 100 of FIG. 1 according to an embodiment of the present general inventive concept. Referring to FIGS. 1 and 2, the temperature-compensated oscillator 1 includes the oscillation unit 100, a bias circuit 200, and a voltage generation unit 300.

The oscillation unit 100 generates an oscillation signal SO having an output frequency using first and second operating voltages VDD and VSS and an operating current $I_D$. The oscillation signal SO is a reference clock signal and may be applied to a logic circuit (not illustrated) that operates in synchronization with the reference clock signal or a clock signal generated from the reference clock signal. The oscillation signal SO may be output to one or more components of an electronic device including the logic circuit so that a function of the electronic device can be performed according to the oscillation signal SO.

As illustrated in FIG. 2, the oscillation unit 100A may be implemented as a ring oscillator that uses the first operating voltage VDD, the second operating voltage VSS, and an operating current $I_D$, but the inventive concept is not limited thereto. The ring oscillator, i.e., the oscillation unit 100A, may include an inverter chain 103 in which a plurality of (or the odd number of) inverters IV (IV1 through IVn) (where "n" is an odd number) are connected in a ring shape. The oscillation unit 100A may include one or more current sources. It is possible that the oscillation unit 100a may include at least two current sources 101 (101-1 through 101-n) and 102 (102-1 through 102-n) to provide the operating current $I_D$ to the inverters IV (IV1 through IVn).

Each of the first current sources 101 (101-1 through 101-n) is connected between the first operating voltage VDD and a corresponding one of the inverters IV (IV1 through IVn). Each of the second current sources 102 (102-1 through 102-n) is connected between a corresponding one of the inverters IV (IV1 through IVn) and the second operating voltage VSS. The first current sources 101 (101-1 through 101-n) and the second current sources 102 (102-1 through 102-n) are controlled by the bias circuit 200. A ground voltage may be usable as the second operating voltage VSS.

Figure 3:
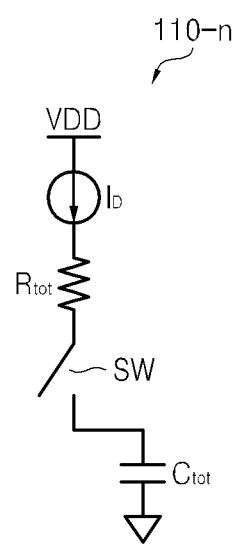
FIG. 3 is an equivalent circuit diagram of the oscillation unit of FIG. 2.

FIG. 3 is an equivalent circuit diagram illustrating a block 110n of the oscillation unit 110A of FIG. 2. Here, a ground voltage may be usable as the second operating voltage VSS.

Referring to FIG. 3, the block 110-n may be represented as an equivalent circuit including a single current source providing the operating current $I_D$, a resistor $R_{tot}$, a capacitor $C_{tot}$, and a switch SW. Accordingly, a frequency $f_{osc}$ of the oscillation signal SO output from the oscillation unit 100A (hereinafter, referred to as an oscillation frequency $f_{osc}$) may be defined as Equation 1:

$$f_{osc} = \frac{I_D}{n \cdot C_{tot} \cdot VDD}. \tag{1}$$

As illustrated in Equation 1, the oscillation frequency $f_{osc}$ is in inverse proportion to the first operating voltage VDD and is in proportion to the operating current $I_D$. Accordingly, a frequency insensitive to temperature change, i.e., temperature-compensated oscillation frequency can be obtained by complementarily changing the operating current $I_D$ and the first operating voltage VDD with respect to a temperature. For instance, when the operating current $I_D$ is increased to increase the frequency of the oscillation signal SO with respect to the increase of the temperature and the first operating voltage VDD is increased to decrease the frequency of the oscillation signal SO with respect to the increase of the temperature, a temperature-compensated oscillation frequency can be obtained.

The bias circuit 200 controls the operating current $I_D$ of the oscillation unit 100. The bias circuit 200 may generate a bias current (IPTAT in FIG. 4) that increases when a temperature increases. In addition, the bias circuit 200 may mirror the bias current IPTAT having a current source proportional to an absolute temperature (PTAT) characteristic as the operating current $I_D$. The bias circuit 200 may be implemented as a current bias circuit, such as a beta multiplier, but the present general inventive concept is not limited thereto. It is possible that other type of a current circuit can be usable as the bias circuit 200.

When the bias current IPTAT which increases as the temperature increases is mirrored as the operating current $I_D$ of the oscillation unit 100, the oscillation frequency $f_{osc}$ output from the oscillation unit 100 also increases as the temperature increases. However, the oscillation frequency $f_{osc}$ of the ring oscillator, i.e., the oscillation unit 100, is in inverse proportion to the first operating voltage VDD of the inverter chain 103, as described above. Assuming that the operating current $I_D$ does not vary with a temperature change, the oscillation frequency $f_{osc}$ is increased when the first operating voltage VDD of the inverter chain 103 decreases and is decreased when the first operating voltage VDD increases.

Using this characteristic, the voltage generation unit 300 generates the first operating voltage VDD and/or the second operating voltage VSS to compensate for the change in the oscillation frequency $f_{osc}$ with respect to the temperature change complementarily with the bias circuit 200. The voltage generation unit 300 generates the first operating voltage VDD and/or the second operating voltage VSS applied to the oscillation unit 100 using a supply voltage (VR in FIG. 4). The first operating voltage VDD may be the same as or different from the supply voltage VR and the second operating voltage VSS may be the same as or different from the ground voltage.

Figure 4:
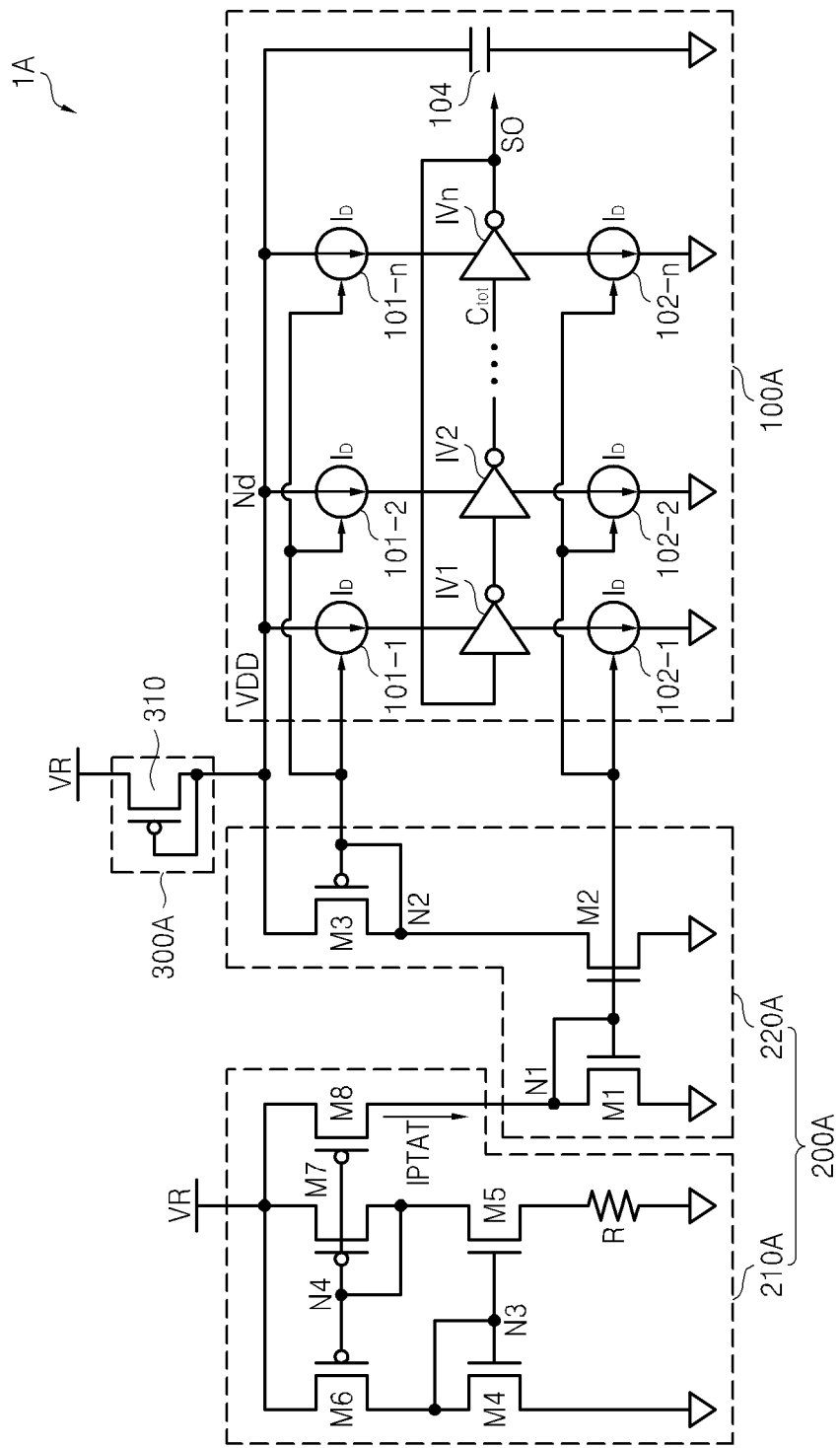
FIG. 4 is a circuit diagram illustrating a temperature-compensated oscillator according to an embodiment of the inventive concept.

FIG. 4 is a circuit diagram illustrating a temperature-compensated oscillator 1A according to an embodiment of the inventive concept. Referring to FIG. 4, the temperature-compensated oscillator 1A includes the oscillation unit 100A, a bias circuit 200A, and a voltage generation unit 300A. The oscillation unit 100A illustrated in FIG. 4 may have the same structure as the oscillation unit 100A illustrated in FIG. 2 or may further include a capacitor 104 connected between the first operating voltage VDD and the ground voltage. The oscillation unit 100A illustrated in FIG. 4 is connected to the first operating voltage VDD and the ground voltage.

The voltage generation unit 300A may include an operating voltage generation transistor 310 which is connected between the supply voltage VR and a node Nd and has a diode-connection. The operating voltage generation transistor 310 may be a diode-connected P-channel metal oxide semiconductor (PMOS) transistor or a bipolar junction transistor (BJT).

When a temperature increases, a gate-source voltage (Vgs) of the diode-connected PMOS transistor decreases, and therefore, the first operating voltage VDD increases. However, when temperature decreases, the Vgs of the diode-connected PMOS transistor increases, and therefore, the first operating voltage VDD decreases. Like the diode-connected PMOS transistor, a base-emitter voltage (Vbe) of the diode-connected BJT decreases when a temperature increases, and therefore, the first operating voltage VDD increases. When the first operating voltage VDD increases under the assumption that other conditions are constant, the oscillation frequency $f_{osc}$ decreases, as described above.

The bias circuit 200A includes a PTAT current source 210A and a current mirror unit 220A. The PTAT current source 210A provides the bias current IPTAT that increases as the temperature increases. The current mirror unit 220A is a circuit to mirror the bias current IPTAT as the operating current $I_D$.

The current mirror unit 220A may include first through third transistors M1 through M3. The first and second transistors M1 and M2 may be N-channel metal oxide semiconductor (NMOS) transistors and the third transistor M3 may be a PMOS transistor. A gate and a drain of the first transistor M1 are connected in common to a first node N1 and a source of the first transistor M1 is connected to the ground voltage. A gate, a drain and a source of the second transistor M2 are respectively connected to the first node N1, a second node N2, and the ground voltage. A gate and a drain of the third transistor M3 are connected in common to the second node N2 and a source of the third transistor M3 is connected to the first operating voltage VDD.

The first node N1 is connected to the second current sources 102 (102-1 through 102-$n$). The second node N2 is connected to the first current sources 101 (101-1 through 101-$n$).

The PTAT current source 210A is connected between the supply voltage VR and the first node N1 to supply the bias current IPTAT to the first node N1. The PTAT current source 210A includes fourth through eighth transistors M4 through M8 and a resistor R. The fourth and fifth transistors M4 and M5 may be NMOS transistors and the sixth through eighth transistors M6, M7, and M8 may be PMOS transistors.

A gate and a drain of the fourth transistor M4 are connected in common to a third node N3 and a source of the fourth transistor M4 is connected to the ground voltage. a gate and a drain of the fifth transistor M5 are respectively connected to the third node N3 and a fourth node N4 and a source of the fifth transistor M5 is connected to the ground voltage via the resistor R. A source, a gate and a drain of the sixth transistor M6 are respectively connected to the supply voltage VR, the fourth node N4, and third node N3. A gate and a drain of the seventh transistor M7 are connected in common to the fourth node N4 and a source of the seventh transistor M7 is connected to the supply voltage VR. A gate, a source and a drain of the eighth transistor M8 are respectively connected to the fourth node N4, the supply voltage VR, and first node N1.

Figure 5:
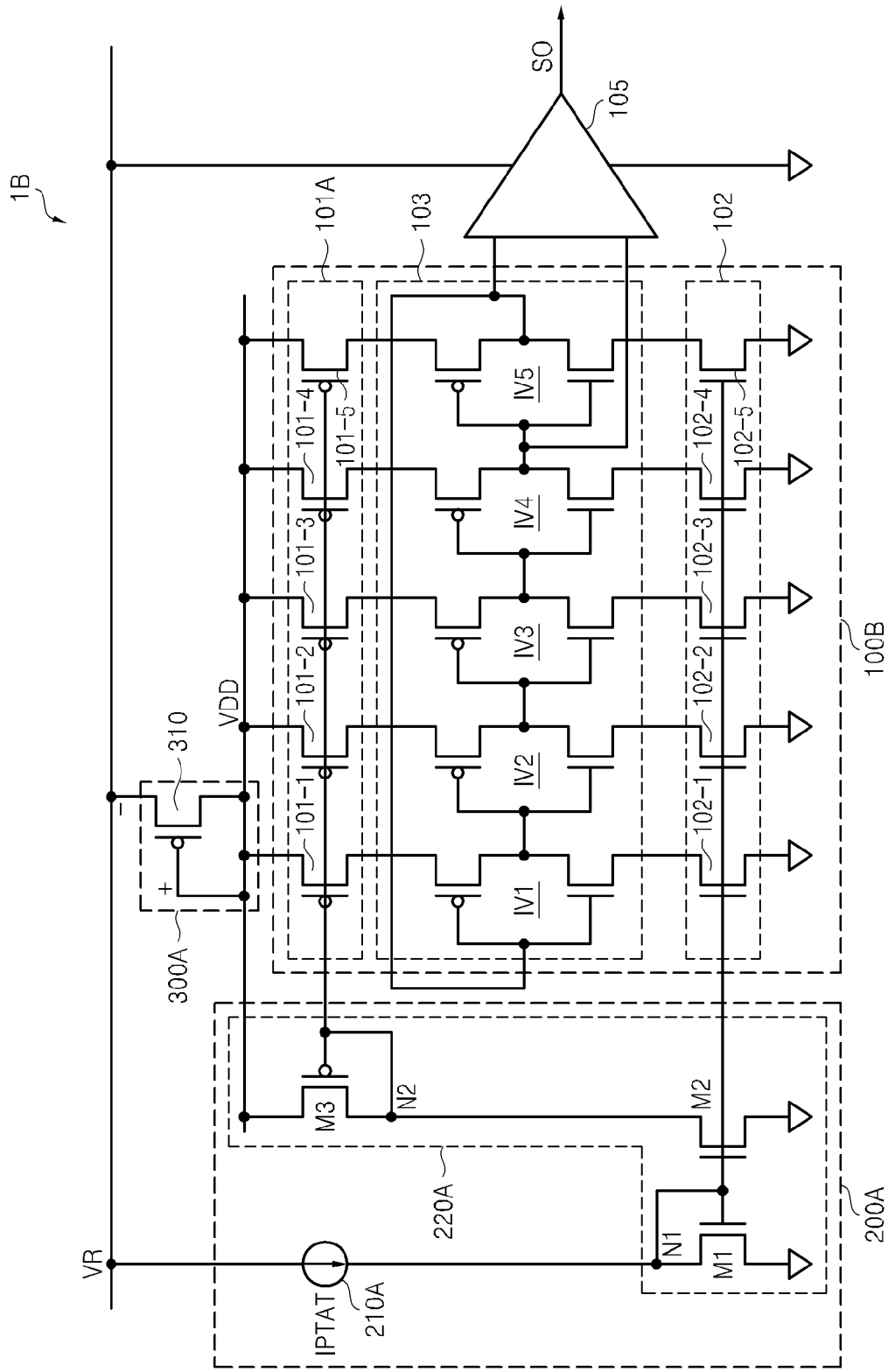
FIG. 5 is a circuit diagram illustrating a temperature-compensated oscillator according to an embodiment of the inventive concept.

FIG. 5 is a circuit diagram illustrating a temperature-compensated oscillator 1B according to an embodiment of the inventive concept. Referring to FIG. 5, the temperature-compensated oscillator 1B includes an oscillation unit 100B, the bias circuit 200A, and the voltage generation unit 300A. The bias circuit 200A and the voltage generation unit 300A may have the same construction as the bias circuit 200A and the voltage generation unit 300A illustrated in FIG. 4, and therefore, descriptions thereof will be omitted.

Like the oscillation unit 100A illustrated in FIGS. 2 and 4, the oscillation unit 100B may include the inverter chain 103 in which a plurality of (or the odd number of) the inverters IV (IV1 through IVn) (where "n" is an odd number) are connected in a ring shape and the first and second current sources 101 (101-1 through 101-$n$) and 102 (102-1 through 102-$n$) providing the operating current $I_D$ for the inverters IV (IV1 through IVn). In the embodiment of FIG. 5, it is assumed that "n" is 5, but the inventive concept is not limited thereto. The oscillation unit 100B may also include a buffer 105 that receives an input signal and an output signal of the last inverter IV5 and outputs the oscillation signal SO.

The first current sources 101 (101-1 through 101-$n$) may be implemented using PMOS transistors. The PMOS transistors of the respective first current sources 101 (101-1 through 101-$n$) may be connected between the first operating voltage VDD and the respective inverters IV (IV1 through IVn), and gates of the PMOS transistors may be connected to in common to the gate of the third transistor M3, i.e., the second node N2 in the bias circuit 200A.

The second current sources 102 (102-1 through 102-$n$) may be implemented using NMOS transistors. The NMOS transistors of the respective second current sources 102 (102-1 through 102-$n$) may be connected between the respective inverters IV (IV1 through IVn) and the ground voltage and gates of the NMOS transistors may be connected to in common to the gate of the first and second transistors M1 and M2, i.e., the first node N1 in the bias circuit 200A.

Therefore, a PTAT characteristic of the operating current $I_D$ with respect to a temperature change and the complementary to an absolute temperature (CTAT) characteristic of the first operating voltage VDD of the inverter chain 103 are offset each other, so that an error in the oscillation frequency $f_{osc}$ of the ring oscillator with respect to a temperature change is significantly reduced.

Figure 6:
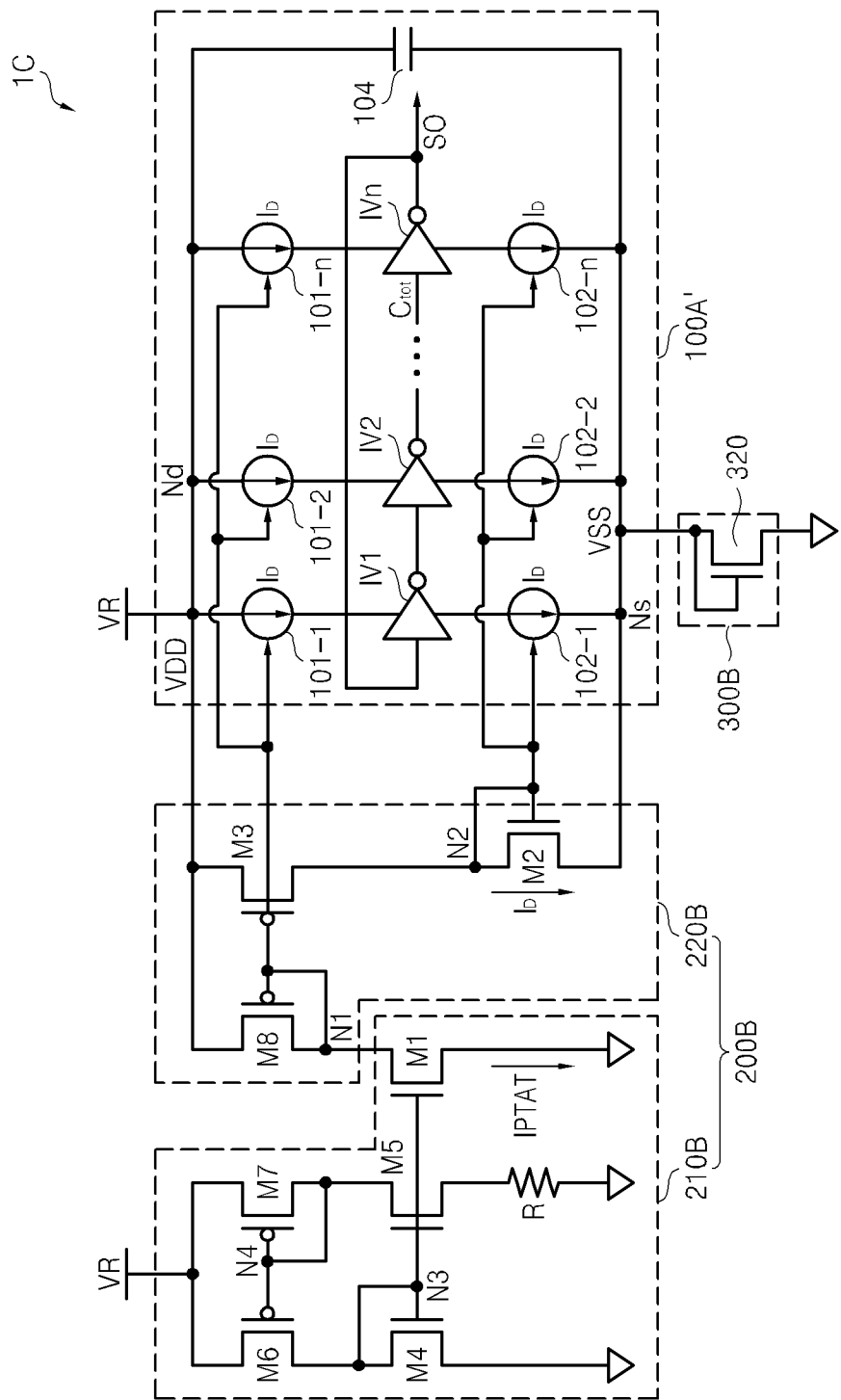
FIG. 6 is a circuit diagram illustrating a temperature-compensated oscillator according to an embodiment of the inventive concept.

FIG. 6 is a circuit diagram illustrating a temperature-compensated oscillator 10 according to an embodiment of the inventive concept. The temperature-compensated oscillator 1C includes an oscillation unit 100A', a bias circuit 200B, and a voltage generation unit 300B. The oscillation unit 100A' may have a similar construction to the oscillation unit 100A illustrated in FIG. 4 but uses a different operating voltage.

The oscillation unit 100A illustrated in FIG. 4 operates using the first operating voltage VDD and the ground voltage, but the oscillation unit 100A' illustrated in FIG. 6 operates using the supply voltage VR and the second operating voltage VSS. In other words, the oscillation unit 100A illustrated in FIG. 4 uses the ground voltage as the second operating voltage VSS and the oscillation unit 100A' illustrated in FIG. 6 uses the supply voltage VR as the first operating voltage VDD.

The voltage generation unit 300B may include an operating voltage generation transistor 320 which is connected between the ground voltage and a node Ns and has a diode-connection. The operating voltage generation transistor 320 may be a diode-connected NMOS transistor or a diode-connected BJT.

When a temperature increases, a gate-source voltage (Vgs) of the diode-connected NMOS transistor 320 decreases, and therefore, the second operating voltage VSS decreases. However, when a temperature decreases, the Vgs of the diode-connected NMOS transistor 320 increases, and therefore, the second operating voltage VSS increases. Like the diode-connected NMOS transistor, a base-emitter voltage (Vbe) of the diode-connected BJT decreases when a temperature increases, and therefore, the second operating voltage VSS decreases.

When the second operating voltage VSS decreases under the assumption that other conditions are constant, a voltage (e.g., VR-VSS) put across both ends of each of the inverters IV (IV1 through IVn) increases, and therefore, the oscillation frequency $f_{osc}$ decreases. In other words, when a temperature increases, the operating voltage of the oscillation unit 100A' is increased by the voltage generation unit 300B, so that the oscillation frequency $f_{osc}$ is decreased. However, the bias current IPTAT increases as a temperature increases, and therefore, the operating current $I_D$ of the oscillation unit 100A' also increases with the temperature. As a result, the oscillation frequency $f_{osc}$ is increased.

Accordingly, a PTAT characteristic of the operating current $I_D$ with respect to a temperature change and the CTAT characteristic of the operating voltage (VDD-VSS) of the inverter chain 103 are offset each other, so that an error in the oscillation frequency $f_{osc}$ of the ring oscillator with respect to a temperature change is significantly reduced.

Figure 7:
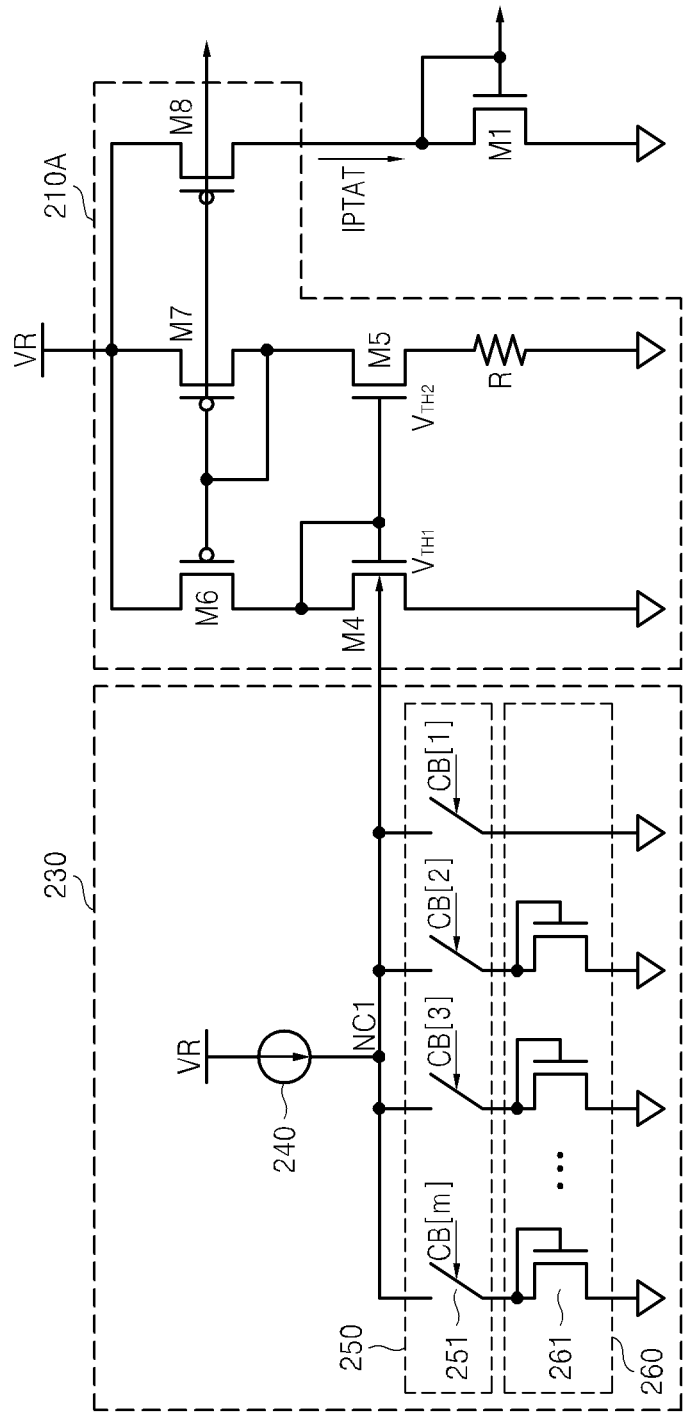
FIG. 7 is a circuit diagram illustrating a bias adjustment circuit usable with a bias circuit of FIG. 4 according to an embodiment of the inventive concept.

FIG. 7 is a circuit diagram illustrating a bias adjustment circuit 230 usable with the PTAT current source 210A of FIG. 4 according to an embodiment of the inventive concept. Referring to FIG. 7, the PTAT current source 210A includes the NMOS transistors M4 and M5, the PMOS transistors M6, M7, and M8, and the resistor R.

The bias adjustment circuit 230 adjusts a bulk voltage level of at least one transistor (e.g., M4) of the PTAT current source 210A. The bias circuits 200, 200A, and 200B may also include the bias adjustment circuit 230 in addition to the PTAT current source 210A and the current mirror unit 220A. The bias adjustment circuit 230 includes a current source 240, a transistor circuit 260 including at least two bias voltage control transistors 261, and a switch circuit 250.

The current source 240 is connected between the supply voltage VR and a bulk node NC1. Each of the bias voltage control transistors 261 may be implemented as a diode-connected NMOS transistor.

The switch circuit 250 includes a plurality of switches 251 which are connected between the respective bias voltage control transistors 261 and the bulk node NC1 and closed and opened in response to switch control signals CB (CB[1] through CB[m]), respectively. As each of the switches 251 is selectively closed or opened, a corresponding one of the bias voltage control transistors 261 is selectively conducted.

A position of the switch circuit 250 and a position of the transistor circuit 260 may be changed. For instance, the bias voltage control transistors 261 may be connected to the bulk node NC1 and the switches 251 may be placed between the bias voltage control transistors 261 and the ground voltage.

The bias voltage control transistors 261 are respectively connected to corresponding ones of the switches 251 in the present embodiment illustrated in FIG. 7, but the inventive concept is not limited thereto. For instance, a common switch may be provided for at least two bias voltage control transistors 261 or at least one bias voltage control transistor 261 may be connected without a switch.

The bias voltage control transistors 261 may be the same or different in size. A voltage level of the bulk node NC1 is adjusted by the bias voltage control transistors 261 selectively conducted according to the switch control signals CB (CB[1] through CB[m]), i.e., the selective opening or closing of the corresponding switches 251, so that the bulk voltage level of the transistor M4 of the PTAT current source 210A is adjusted. As a result, a level of the bias current IPTAT is adjusted, and therefore, the operating current $I_D$ is also adjusted. Although the operating current and the operating voltage are variable to reduce a variation of the frequency of the oscillation signal SO according to the temperature change, the variable operating current $I_D$, can be further adjusted such that the oscillation signal can have different frequencies corresponding to different modes. The different frequencies may be a high frequency to be usable in a normal mode and a lower frequency to be usable in a non-normal mode, that is, an ultra-low current mode, a standby mode or a sleep mode thereof.

Figure 8:
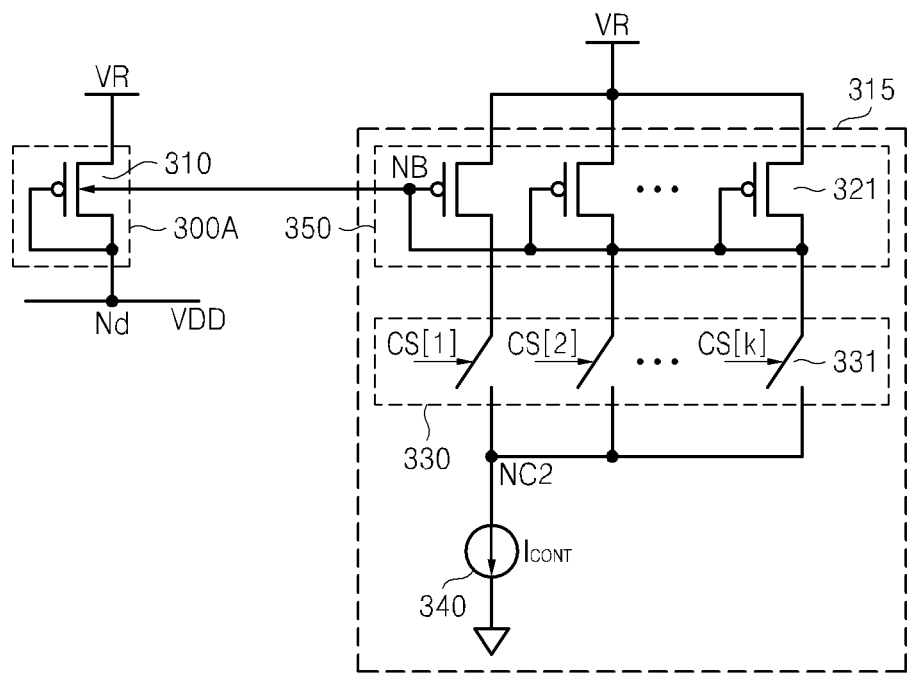
FIG. 8 is a circuit diagram illustrating a bulk voltage control circuit usable with a voltage generation unit of FIG. 5 according to an embodiment of the inventive concept.

FIG. 8 is a circuit diagram illustrating a bulk voltage control circuit 315 usable with the voltage generation unit 300A illustrated in FIG. 5 according to an embodiment of the inventive concept. Referring to FIG. 8, the bulk voltage control circuit 315 adjusts the bulk voltage level of the operating voltage generation transistor 310 of the voltage generation unit 300A.

The bulk voltage control circuit 315 includes a current source 340, a transistor circuit 350 including at least two bulk voltage control transistors 321, and a switch circuit 330. Each of the bulk voltage control transistors 321 may be implemented as a diode-connected PMOS transistor. The bulk voltage control transistors 321 are connected between the supply voltage VR and the switch circuit 330. The switch circuit 330 includes a plurality of switches 331 which are connected between the respective bulk voltage control transistors 321 and a common node NC2 and closed and opened in response to digital control signals CS (CS[1] through CS[k]), respectively.

The current source 340 is connected between the common node NC2 and a potential, for example, the ground voltage. As each of the switches 331 is selectively closed or opened, a corresponding one of the bulk voltage control transistors 321 is selectively conducted.

A position of the switch circuit 330 and a position of the transistor circuit 350 may be changed. For instance, the switches 331 may be connected to the supply voltage VR and the bulk voltage control transistors 321 may be placed between the switches 331 and the common node NC2.

The bulk voltage control transistors 321 are respectively connected to corresponding ones of the switches 331 as illustrated in FIG. 8, but the inventive concept is not limited thereto. For instance, a common switch may be provided for at least two bulk voltage control transistors 321 or at least one bulk voltage control transistor 321 may be connected without a switch.

The bulk voltage control transistors 321 may be the same or different in size. A voltage level of a node NB is adjusted by the bulk voltage control transistors 321 selectively conducted according to the digital control signals CS (CS[1] through CS[k]), i.e., the selective opening or closing of the switches 331, so that the bulk voltage level of the operating voltage generation transistor 310 of the voltage generation unit 300A is adjusted. As a result, a level of the first operating voltage VDD generated by the voltage generation unit 300A is adjusted. Although the operating current and the operating voltage are variable to reduce a variation of the frequency of the oscillation signal SO according to the temperature change, the variable operating voltage can be further adjusted such that the oscillation signal can have different frequencies corresponding to different modes. The different frequencies may be a high frequency to be usable in a normal mode and a lower frequency to be usable in a non-normal mode, that is, an ultra mode, a standby mode or a sleep mode thereof.

Figure 9:
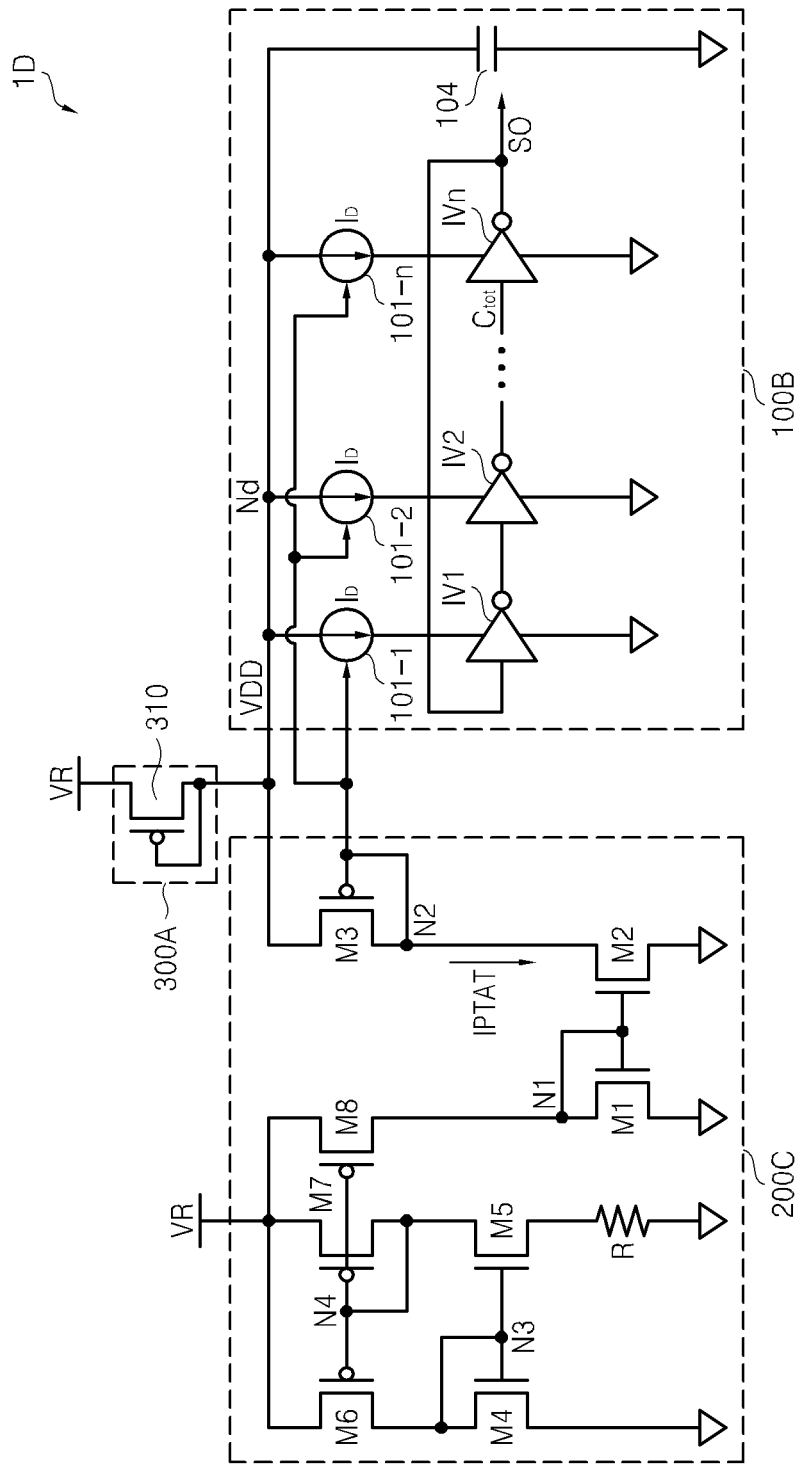
FIG. 9 is a circuit diagram illustrating a temperature-compensated oscillator according to an embodiment of the inventive concept.

FIG. 9 is a circuit diagram illustrating a temperature-compensated oscillator 1D according to an embodiment of the inventive concept. Referring to FIG. 9, the temperature-compensated oscillator 1D includes the oscillation unit 100B, a bias circuit 200C, and the voltage generation unit 300A. The voltage generation unit 300A illustrated in FIG. 9 may be the same as the voltage generation unit 300A illustrated in FIG. 4, and therefore, a description thereof will be omitted.

The oscillation unit 100B illustrated in FIG. 9 includes the inverter chain 103 in which an odd number of the inverters IV1 through IVn (where "n" is an odd number) and the first current sources 101 (101-1 through 101-n) but does not include the second current sources 102 (102-1 through 102-n) illustrated in the oscillation unit 100A of FIG. 4. The bias circuit 200C may have the same construction as the bias circuit 200A illustrated in FIG. 4 with the exception that a signal line for controlling the second current sources 102 (102-1 through 102-n) of FIG. 4 is omitted from the bias circuit 200C of FIG. 9. Since the oscillation unit 100A illustrated in FIG. 4 includes the second current sources 102 (102-1 through 102-n), the first node N1 to which the gate and drain of the first transistor M1 and the gate of the second transistor M2 in the bias circuit 200A are connected in common is connected to the second current sources 102 (102-1 through 102-n). However, since the oscillation unit 100B illustrated in FIG. 9 does not include the second current sources 102 (102-1 through 102-n), a line connecting the first node N1 to the second current sources 102-1 through 102-n is not required, either.

The bias circuit 200C generates the bias current IPTAT that increases as a temperature increases. Accordingly, the operating current $I_D$, i.e., the mirrored current of the bias current IPTAT also increases as the temperature increases.

Meanwhile, the voltage generation unit 300A generates the first operating voltage VDD that increases as the temperature increases. As described above, the oscillation frequency $f_{osc}$ decreases when the first operating voltage VDD increases and the oscillation frequency $f_{osc}$ increases when the operating current $I_D$ increases. Accordingly, when the temperature increases, the decrease of the oscillation frequency $f_{osc}$ due to the increase of the first operating voltage VDD and the increase of the oscillation frequency $f_{osc}$ due to the increase of the operating current $I_D$ may offset each other, so that the oscillation signal SO having the oscillation frequency $f_{osc}$ insensitive to a temperature change is obtained. It is possible that a variation (decrease or increase) of the oscillation frequency $f_{osc}$ due to a change (increase or decrease) of the first operating voltage VDD and a variation (increase or decrease) of the oscillation frequency $f_{osc}$ due to a change (increase or decrease) of the operating current $I_D$ may partially offset each other. It is also possible that the variation of the oscillation frequency $f_{osc}$ of the oscillation signal SO is reduced at least due to a simultaneous change of the increase (or decrease) of the first operating voltage VDD and the increase (decrease) of the operating current $I_D$ according to the temperature change. The association of the change (increase or decrease) of the first operating voltage VDD and the change (increase or decrease) of the operating current $I_D$ according to the temperature change may affect (reduce) the variation of the oscillation frequency $f_{osc}$ of the oscillation signal SO as described above or hereinafter. The oscillation frequency $f_{osc}$ of the oscillation signal SO may be maintained stable or may be in a variation range, for example, about within 2% from a reference frequency in a case where a temperature change is between 20° C. and 80° C., for example. The reference frequency may be referred to as a center frequency of a middle portion of a temperate variation between a low temperature and a high temperature in which an oscillation is usable to provide an oscillation signal to an external unit or device.

Figure 10:
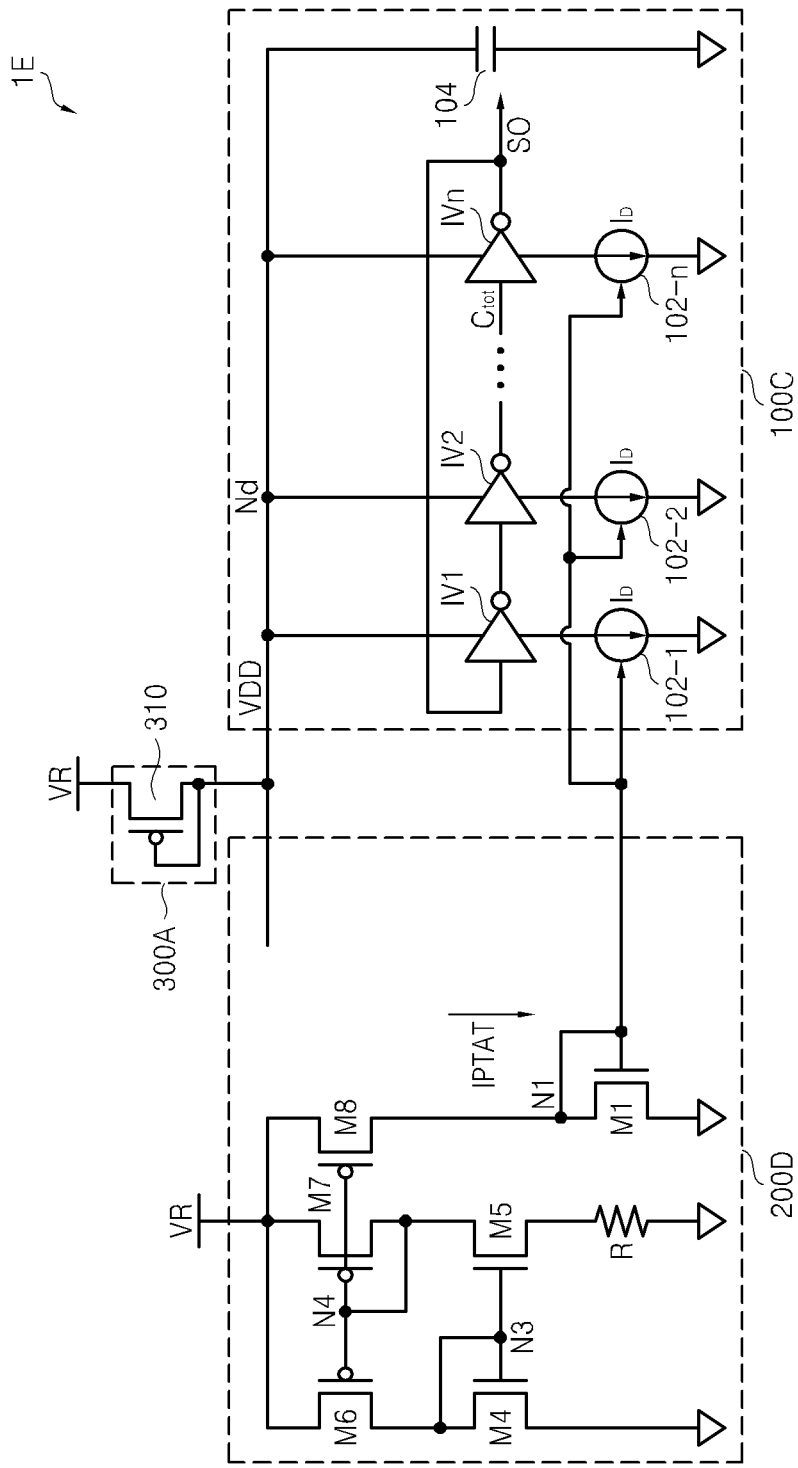
FIG. 10 is a circuit diagram illustrating a temperature-compensated oscillator according to an embodiment of the inventive concept.

FIG. 10 is a circuit diagram illustrating a temperature-compensated oscillator 1E according to an embodiment of the inventive concept. Referring to FIG. 10, the temperature-compensated oscillator 1E includes an oscillation unit 100C, a bias circuit 200D, and the voltage generation unit 300A. The voltage generation unit 300A illustrated in FIG. 10 may be the same as the voltage generation unit 300A illustrated in FIG. 4, and therefore, a description thereof will be omitted.

The oscillation unit 100C illustrated in FIG. 10 includes the inverter chain 103 in which an odd number of the inverters IV (IV1 through IVn) (where "n" is an odd number) and the second current sources 102 (102-1 through 102-n) but does not include the first current sources 101 (101-1 through 101-n) of FIG. 4.

The bias circuit 200D may include the first transistor M1, the fourth through eighth transistors M4 through M8, and the resistor R. The first, fourth and fifth transistors M1, M4, and M5 may be NMOS transistors and the sixth, seventh, and eighth transistors M6, M7, and M8 may be PMOS transistors.

The gate and drain of the first transistor M1 are connected in common to the first node N1 and the source thereof is connected to the ground voltage. The first node N1 is connected to the second current sources 102 (102-1 through 102-n).

The gate and drain of the fourth transistor M4 are connected in common to the third node N3 and the source thereof is connected to the ground voltage. The gate and drain of the fifth transistor M5 are respectively connected to the third node N3 and the fourth node N4 and the source thereof is connected to the ground voltage via the resistor R. The source, gate and drain of the sixth transistor M6 are respectively connected to the supply voltage VR, the fourth node N4, and the third node N3. The gate and drain of the seventh transistor M7 are connected in common to the fourth node N4 and the source thereof is connected to the supply voltage VR. The gate, source and drain of the eighth transistor M8 are respectively connected to the fourth node N4, the supply voltage VR, and the first node N1.

The bias circuit 200D having the above-described construction does not need to control the first current sources 101-1 through 101-*n* and thus not include the second and third transistors M2 and M3, as compared to the bias circuit 200A illustrated in FIG. 4.

The bias circuit 200D generates the bias current IPTAT that increases as temperature increases. Accordingly, the operating current $I_D$, i.e., the mirrored current of the bias current IPTAT also increases as temperature increases. Meanwhile, the voltage generation unit 300A generates the first operating voltage VDD that increases as temperature increases.

As described above, the oscillation frequency $f_{osc}$ decreases when the first operating voltage VDD increases and the oscillation frequency $f_{osc}$ increases when the operating current $I_D$ increases. Accordingly, when a temperature increases, the decrease of the oscillation frequency $f_{osc}$ due to the increase of the first operating voltage VDD and the increase of the oscillation frequency $f_{osc}$ due to the increase of the operating current $I_D$ may offset each other, so that the oscillation signal SO having the oscillation frequency $f_{osc}$ insensitive to a temperature change is obtained. It is possible that the decrease of the oscillation frequency $f_{osc}$ due to the increase of the first operating voltage VDD and the increase of the oscillation frequency $f_{osc}$ due to the increase of the operating current $I_D$ may partially offset each other. It is also possible that a variation of the oscillation frequency $f_{osc}$ of the oscillation signal SO is reduced at least due to a simultaneous change of the increase of the first operating voltage VDD and the increase of the operating current $I_D$ according to the temperature change. The association of the increase of the first operating voltage VDD and the increase of the operating current $I_D$ according to the temperature change may affect (reduce) a variation of the oscillation frequency $f_{osc}$ of the oscillation signal SO as described above or hereinafter.

Figure 11:
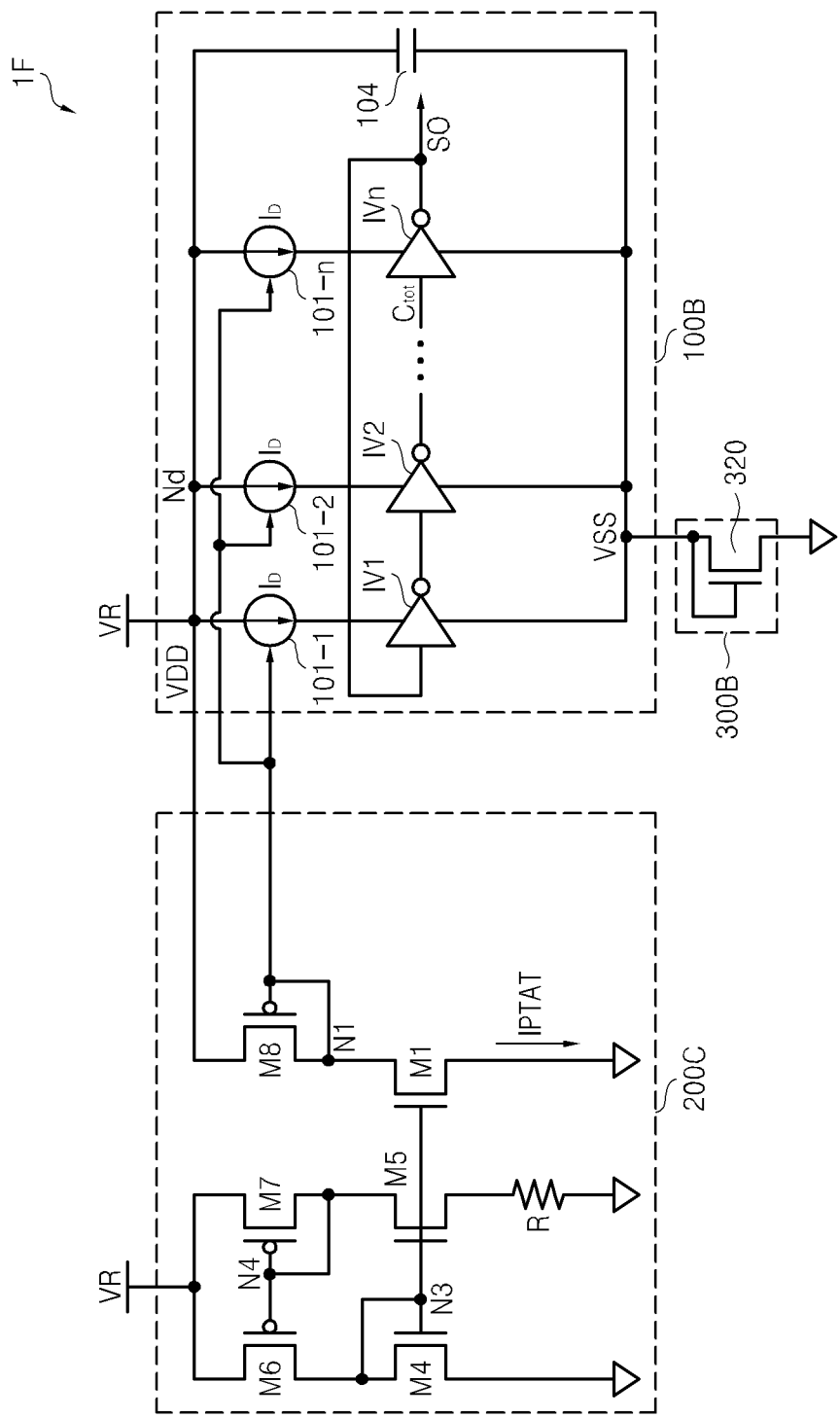
FIG. 11 is a circuit diagram illustrating a temperature-compensated oscillator according to an embodiment of the inventive concept.

FIG. 11 is a circuit diagram illustrating a temperature-compensated oscillator 1F according to an embodiment of the inventive concept. Referring to FIG. 11, the temperature-compensated oscillator 1F includes the oscillation unit 100B, a bias circuit 200E, and the voltage generation unit 300B. The voltage generation unit 300B illustrated in FIG. 11 may be the same as the voltage generation unit 300B illustrated in FIG. 6, and therefore, a description thereof will be omitted. The oscillation unit 100B illustrated in FIG. 11 may be the same as the oscillation unit 100B illustrated in FIG. 9, and therefore, a description thereof will be omitted.

The bias circuit 200E may include the first transistor M1, the fourth through eighth transistors M4 through M8, and the resistor R. The oscillation unit 100B of FIG. 11 does not include the second current sources 102 (102-1 through 102-*n*) of the oscillation unit 100A' of FIG. 6, and therefore, the bias circuit 200E does not include the second and third transistors M2 and M3 of the bias circuit 200B of FIG. 6. The first, fourth and fifth transistors M1, M4, and M5 may be NMOS transistors and the sixth, seventh and eighth transistors M6, M7, and M8 may be PMOS transistors.

The gate and drain of the eighth transistor M8 are connected in common to the first node N1 and the source thereof is connected to the first operating voltage VDD. The first node N1 is connected to the first current sources 101 (101-1 through 101-*n*).

The gate and drain of the fourth transistor M4 are connected in common to the third node N3 and the source thereof is connected to the ground voltage. The gate and drain of the fifth transistor M5 are respectively connected to the third node N3 and the fourth node N4 and the source thereof is connected to the ground voltage via the resistor R. The source, gate and drain of the sixth transistor M6 are respectively connected to the supply voltage VR, the fourth node N4, and the third node N3. The gate and drain of the seventh transistor M7 are connected in common to the fourth node N4 and the source thereof is connected to the supply voltage VR.

The bias circuit 200E generates the bias current IPTAT that increases as temperature increases. Accordingly, the operating current $I_D$, i.e., the mirrored current of the bias current IPTAT also increases as a temperature increases. Meanwhile, the voltage generation unit 300B generates the second operating voltage VSS that decreases as the temperature increases.

As described above, the oscillation frequency $f_{osc}$ decreases when the second operating voltage VSS decreases and it increases when the operating current $I_D$ increases. Accordingly, when the temperature increases, the decrease of the oscillation frequency $f_{osc}$ due to the decrease of the second operating voltage VSS and the increase of the oscillation frequency $f_{osc}$ due to the increase of the operating current $I_D$ may offset each other, so that the oscillation signal SO having the oscillation frequency $f_{osc}$ insensitive to a temperature change is obtained. It is possible that the decrease of the oscillation frequency $f_{osc}$ due to the decrease of the second operating voltage VSS and the increase of the oscillation frequency $f_{osc}$ due to the increase of the operating current $I_D$ may partially offset each other. It is also possible that a variation of the oscillation frequency $f_{osc}$ of the oscillation signal SO is reduced at least due to a simultaneous change of the decrease of the second operating voltage VSS and the increase of the operating current $I_D$ according to the temperature change. The association of the decrease of the second operating voltage VSS and the increase of the operating current $I_D$ according to the temperature change may affect (reduce) a variation of the oscillation frequency $f_{osc}$ of the oscillation signal SO as described above or hereinafter.

Figure 12:
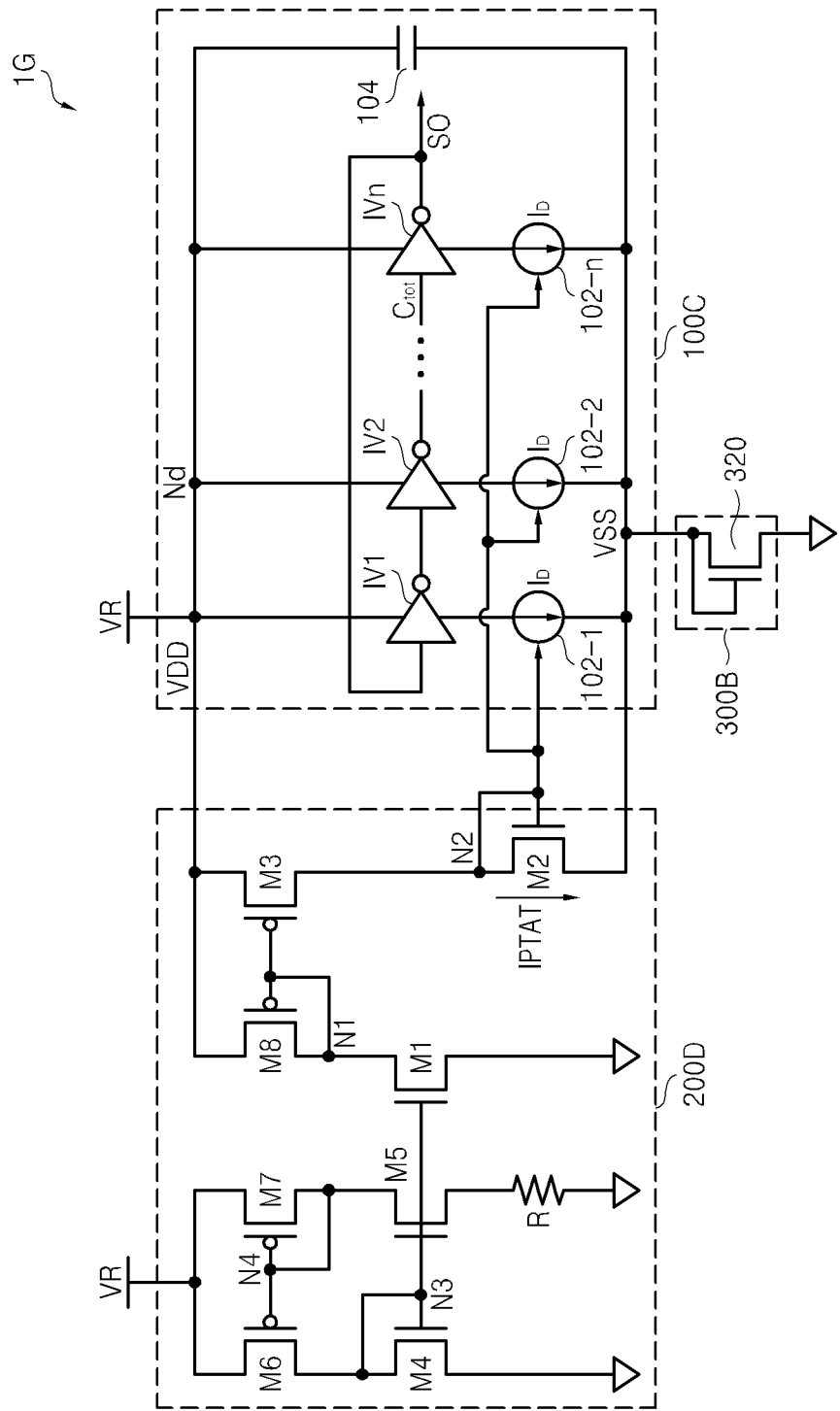
FIG. 12 is a circuit diagram illustrating a temperature-compensated oscillator according to an embodiment of the inventive concept.

FIG. 12 is a circuit diagram illustrating a temperature-compensated oscillator 1G according to an embodiment of the inventive concept. Referring to FIG. 12, the temperature-compensated oscillator 1G includes the oscillation unit 100C, a bias circuit 200F, and the voltage generation unit 300B. The voltage generation unit 300B illustrated in FIG. 12 may be the same as the voltage generation unit 300B illustrated in FIG. 6, and therefore, a description thereof will be omitted. The oscillation unit 100C illustrated in FIG. 12 may be the same as the oscillation unit 100C illustrated in FIG. 10, and therefore, a description thereof will be omitted.

The bias circuit 200F may have the same construction as the bias circuit 200B illustrated in FIG. 6, with the exception that a signal line for controlling the first current sources 101 (101-1 through 101-*n*) of FIG. 6 is omitted from the bias circuit 200F of FIG. 12 since the oscillation unit 100C does not include the first current sources 101 (101-1 through 101-*n*). The second node N2 to which the gate and drain of the second transistor M2 are connected in common is connected to the second current sources 102 (102-1 through 102-*n*).

The gate and drain of the eighth transistor M8 are connected in common to the first node N1 and the source thereof is connected to the first operating voltage VDD. The gate, the drain and the source of the third transistor M3 are respectively connected to the first node N1, the second node 2, and the first operating voltage VDD. The gate and drain of the fourth transistor M4 are connected in common to the third node N3 and the source thereof is connected to the ground voltage. The gate and drain of the fifth transistor M5 are respectively connected to the third node N3 and the fourth node N4 and the source thereof is connected to the ground voltage via the resistor R. The source, gate and drain of the sixth transistor M6 are respectively connected to the supply voltage VR, the fourth node N4, and the third node N3. The gate and drain of the seventh transistor M7 are connected in common to the fourth node N4 and the source thereof is connected to the supply voltage VR.

The bias circuit 200F generates the bias current IPTAT that increases as temperature increases. Accordingly, the operating current $I_D$, i.e., the mirrored current of the bias current IPTAT also increases as temperature increases. Meanwhile, the voltage generation unit 300B generates the second operating voltage VSS that decreases as temperature increases.

Figure 13:
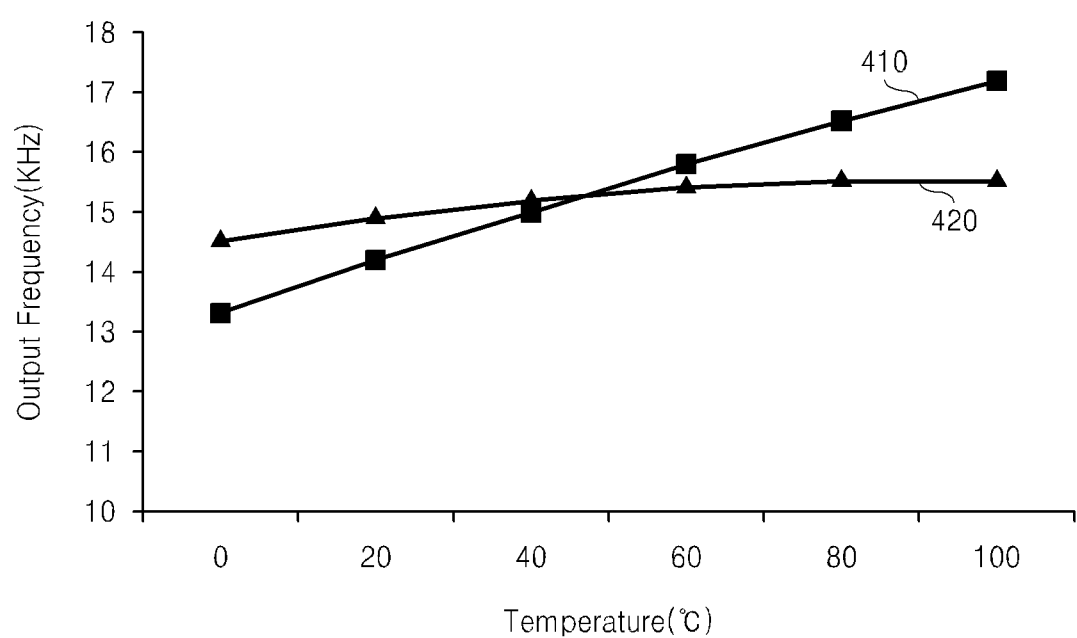
FIG. 13 is a graph illustrating a simulation result of an output frequency of a temperature-compensated oscillator according to an embodiment of the inventive concept and a simulation result of an output frequency of an oscillator according to a comparison example.

As described above, the oscillation frequency $f_{osc}$ decreases when the second operating voltage VSS decreases and the oscillation frequency $f_{osc}$ increases when the operating current $I_D$ increases. Accordingly, when temperature increases, the decrease of the oscillation frequency $f_{osc}$ due to the decrease of the second operating voltage VSS and the increase of the oscillation frequency $f_{osc}$ due to the increase of the operating current $I_D$ may offset each other, so that the oscillation signal SO having the oscillation frequency $f_{osc}$ insensitive to temperature change is obtained. It is possible that the decrease of the oscillation frequency $f_{osc}$ due to the decrease of the second operating voltage VSS and the increase of the oscillation frequency $f_{osc}$ due to the increase of the operating current $I_D$ may partially offset each other. It is also possible that a variation of the oscillation frequency $f_{osc}$ of the oscillation signal SO is reduced at least due to a simultaneous change of the decrease of the second operating voltage VSS and the increase of the operating current $I_D$ according to the temperature change. The association of the decrease of the second operating voltage VSS and the increase of the operating current $I_D$ according to the temperature change may affect (reduce) a variation of the oscillation frequency $f_{osc}$ of the oscillation signal SO as described above or hereinafter FIG. 13 is a graph illustrating a simulation result of an output frequency of a temperature-compensated oscillator according to the embodiment of the inventive concept and a simulation result of an output frequency of an oscillator according to a comparison example. Referring to FIG. 13, a curve 410 illustrates the output frequency of the oscillator with respect to a temperature in the comparison example and a line 420 illustrates the output frequency of the oscillator with respect to a temperature in the embodiment of the inventive concept. The line 420 may be a curve.

As described above, the oscillator according to the present embodiment of the inventive concept includes a PTAT current source to provide an operating current increasing with the increase of a temperature and a voltage generation unit to control an operating voltage so that the output frequency is decreased. The oscillator according to the comparison example uses only the PTAT current source to provide an operating current increasing with the increase of temperature without the voltage generation unit.

As illustrated in FIG. 13, while the output frequency of the oscillator according to the comparison example has a variation of about ±12% with respect to a temperature, the output frequency of the oscillator according to the present embodiment of the inventive concept has a variation of only about ±2% with respect to a temperature and thus remarkably increase the accuracy of a frequency with respect to a temperature.

As described above, according to the embodiment of the inventive concept, the output frequency of an oscillator can be compensated using an operating current proportional to a temperature and a power supply voltage having a predetermined value with respect to the temperature (e.g., a voltage proportional or inverse proportional to the temperature) instead of using a temperature-compensated reference current only that is usually used as an operating current of a ring oscillator. Therefore, according to the embodiment of the inventive concept, a ring oscillator having a temperature-compensated oscillation frequency (e.g., 15 KHz can be embodied with a low operating current (e.g., 200 nA or less) using a small resistor (e.g., a single resistor having a resistance of 2 MΩ or less).

Figure 14:
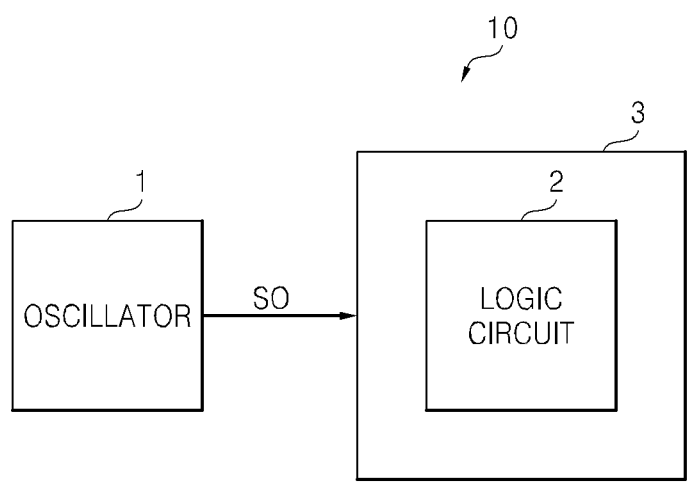
FIG. 14 is a schematic block diagram illustrating an electronic device according to an embodiment of the inventive concept.

FIG. 14 is a schematic block diagram illustrating an electronic device 10 according to an embodiment of the inventive concept. Referring to FIG. 14, the electronic device 10 includes a temperature-compensated oscillator 1 and a logic circuit 2. The temperature-compensated oscillator 1 may be one of the temperature-compensated oscillators 1 and 1A through 1G that have been described above with reference to FIGS. 1 through 12 according to the embodiment of the inventive concept.

The logic circuit 2 uses the oscillation signal SO as a clock signal and may operate in synchronization with the oscillation signal SO or a clock signal generated from the oscillation signal SO. The logic circuit 2 may be a central processing unit (CPU), a graphics processing unit (GPU), a memory, or a communication circuit (e.g., a modem or a transceiver) to communicate with an external device, but the present general inventive concept is not limited thereto. The logic circuit 2 may be included in a functional unit 3 of the electronic device 10. The functional unit 3 may include a user interface to communicate with a user to output data to the user or receive a user command from the user, and a video and/or audio uit to output an image and/or sound. The image may be displayed on a display unit (not illustrated). The display unit may be a touch panel as an output element and a user command input element.

The oscillation signal SO may be usable in components of the functional unit 3. It is possible that the oscillation signal SO may be usable to operate the electronic device including the logic circuit 2 in different operating modes corresponding to different oscillation frequencies. The oscillation signal SO may be usable as at least one of the different oscillation frequencies or may be usable to generate (or to be converted into) at least one of the different oscillation frequencies to perform the corresponding operating mode.

The electronic device 10 may be a memory device, a cellular phone, a smart phone, a personal digital assistant (PDA), a wireless communication device, a digital camera, or a solid state drive (SSD), but the present general inventive concept is not limited thereto.

As described above, according to the embodiment of the inventive concept, the output frequency of an oscillator can be compensated using an operating current proportional to a temperature and a power supply voltage having a predetermined value with respect to the temperature instead of using a temperature-compensated reference current only that is usually used as an operating current of a ring oscillator. As a result, a stable frequency characteristic can be obtained with respect to a temperature change. In addition, a size of a resistance element required to implement a low-current oscillator is remarkably reduced, so that a size of the oscillator is reduced. The voltage generation unit compensates for a change in the frequency of the oscillation signal with respect to a change in the temperature complementarily with the bias circuit by controlling the operating voltage so that the frequency of the oscillation signal decreases as the temperature increases.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A temperature-compensated oscillator comprising:
   an oscillation unit configured to generate an oscillation signal using an operating current and an operating voltage;
   a bias circuit configured to control the operating current so that a frequency of the oscillation signal increases as a temperature increases; and
   a voltage generation unit configured to generate the operating voltage that varies with the temperature,
   wherein the voltage generation unit comprises:
      an operating voltage generation transistor; and
      a bulk voltage controller configured to control a bulk voltage of the operating voltage generation transistor, and
   wherein the voltage generation unit compensates for a change in the frequency of the oscillation signal with respect to a change in the temperature complementarily with the bias circuit by controlling the operating voltage so that the frequency of the oscillation signal decreases as the temperature increases.

2. The temperature-compensated oscillator of claim 1, wherein the oscillation unit comprises:
   an odd number of inverters connected in series in a ring shape; and
   at least one of a first current source connected between a first operating voltage of the operating voltage and the corresponding inverters and controlled by the bias circuit and a second current source connected to the corresponding inverters and a second operating voltage of the operating voltage and controlled by the bias circuit.

3. The temperature-compensated oscillator of claim 2, wherein the bias circuit comprises a current source proportional to an absolute temperature (PTAT) current source to generate the operating current that increases as the temperature increases.

4. The temperature-compensated oscillator of claim 3, wherein the operating voltage generation transistor is connected between a supply voltage and the first operating voltage and having a diode connection.

5. The temperature-compensated oscillator of claim 1, wherein the bulk voltage controller comprises:
   at least two bulk voltage control transistors each configured to have a gate and a drain which are connected in common to a bulk of the operating voltage generation transistor; and
   a switch circuit configured to be connected to at least one of the bulk voltage control transistors and to be closed and opened in response to a digital control signal of at least two bits.

6. The temperature-compensated oscillator of claim 4, wherein the PTAT current source comprises:
   a first transistor having a gate and a drain connected in common to a first node;
   a fourth transistor having a gate and a drain connected in common to a third node;
   a fifth transistor having a gate connected to the third node and a drain connected to a fourth node;
   a sixth transistor having a source connected to the supply voltage, a gate connected to the fourth node, and a drain connected to the third node;
   a seventh transistor having a gate and a drain connected in common to the fourth node and a source connected to the supply voltage; and
   an eighth transistor having a gate connected to the fourth node, a source connected to the supply voltage, and a drain connected to the first node.

7. The temperature-compensated oscillator of claim 6, wherein the first node is connected to the second current source.

8. The temperature-compensated oscillator of claim 6, wherein:
   the PTAT current source further comprises:
      a second transistor having a gate connected to the first node and a drain connected to a second node, and
      a third transistor having a gate and a drain connected in common to the second node and a source connected to the first operating voltage; and
   the second node is connected to the first current source.

9. The temperature-compensated oscillator of claim 3, wherein the operating voltage generation transistor is connected between a ground voltage and the second operating voltage and having a diode connection.

10. The temperature-compensated oscillator of claim 9, wherein the PTAT current source comprises:
    a first transistor having a drain connected to a first node and a gate connected to a third node;
    a fourth transistor having a gate and a drain connected in common to the third node;
    a fifth transistor having a gate connected to the third node and a drain connected to a fourth node;
    a sixth transistor having a source connected to a supply voltage, a gate connected to the fourth node, and a drain connected to the third node;
    a seventh transistor having a gate and a drain connected in common to the fourth node and a source connected to the supply voltage; and
    an eighth transistor having a drain connected to the first node.

11. The temperature-compensated oscillator of claim 10, wherein the first node is connected to the first current source.

12. The temperature-compensated oscillator of claim 10, wherein the PTAT current source further comprises:
    a second transistor having a gate and a drain connected in common to a second node and a source connected to the second operating voltage; and
    a third transistor having a gate connected to the first node and a drain connected to the second node, and
    the second node is connected to the second current source.

13. The temperature-compensated oscillator of claim 10, wherein the bias circuit further comprises a bias adjustment circuit configured to adjust a bulk voltage level of at least one transistor among the first transistor and the fourth through eighth transistors.

14. The temperature-compensated oscillator of claim 13, wherein the bias circuit comprises:
    at least two bulk voltage control transistors connected in common to a bulk of at least one transistor among the first transistor and the fourth through eighth transistors; and
    a switch circuit configured to be connected to at least one of the bulk voltage control transistors and to be closed and opened in response to a digital control signal.

15. An electronic device comprising:
a temperature-compensated oscillator configured to generate an oscillation signal having an output frequency insensitive to a temperature change; and
a logic circuit configured to operate in response to the oscillation signal,
wherein the temperature-compensated oscillator comprises:
    an oscillation unit configured to generate the oscillation signal using an odd number of inverters connected in series in a ring shape;
    a bias circuit configured to increase an operating current of each of the inverters as temperature increases; and
    a voltage generation unit configured to increase an operating voltage put across both ends of each inverter as the temperature increases,
    wherein the voltage generation unit comprises:
        an operating voltage generation transistor; and
        a bulk voltage controller configured to control a bulk voltage of the operating voltage generation transistor.

16. The electronic device of claim 15, wherein:
the oscillation unit comprises at least one current source of a first current source connected between a first operating voltage and the inverters and being controlled by the bias circuit and a second current source connected to the inverters and a second operating voltage and being controlled by the bias circuit, and
the voltage generation unit comprises at least one transistor of a first operating current generation transistor connected between a supply voltage and the first operating voltage and having a diode connection and a second operating current generation transistor connected between a ground voltage and the second operating voltage and having the diode connection.

17. A temperature-compensated oscillator usable with an electronic device, comprising:
an oscillation unit having inverters as a ring oscillator to be supplied with an operating voltage and an operating current which are variable according to a temperature change and to output an oscillation signal such that a characteristic of the operating current and a characteristic of the operating voltage can be offset to maintain a frequency of the oscillation signal stable regardless of the temperature change; and
a voltage generation unit comprising an operating voltage generation transistor and a bulk voltage controller configured to control a bulk voltage of the operating voltage generation transistor such that the operating voltage is adjusted according to the bulk voltage.

18. The temperature-compensated oscillator of claim 17, further comprising:
a bias circuit having transistors generates the operating current to increase when the temperature increase,
wherein the voltage generation unit generates the operating voltage to be changed with the temperature.

19. The temperature-compensated oscillator of claim 17, wherein the variable operating voltage and the variable operating current are simultaneously applied to the corresponding inverters of the oscillation unit.

* * * * *